(12) United States Patent
Vaiyapuri et al.

(10) Patent No.: US 7,107,777 B2
(45) Date of Patent: Sep. 19, 2006

(54) MEMS HEAT PUMPS FOR INTEGRATED CIRCUIT HEAT DISSIPATION

(75) Inventors: Venkateshwaran Vaiyapuri, Singapore (SG); Fred Fishburn, Boise, ID (US)

(73) Assignee: Micro Technology, Inc., Boise, ID (US)

( * ) Notice: Subject to any disclaimer, the term of this patent is extended or adjusted under 35 U.S.C. 154(b) by 3 days.

(21) Appl. No.: 10/639,836

(22) Filed: Aug. 12, 2003

(65) Prior Publication Data

US 2004/0031281 A1 Feb. 19, 2004

(30) Foreign Application Priority Data

Jul. 24, 2000 (SG) .................. 200004125

(51) Int. Cl.
*F25D 23/12* (2006.01)
*H05K 7/20* (2006.01)

(52) U.S. Cl. .............. 62/259.2; 165/104.33; 361/689; 257/713

(58) Field of Classification Search .......... 62/259.2; 165/104.33, 80.4; 417/322, 413.2; 137/814, 137/826, 833; 257/713, 714; 438/122
See application file for complete search history.

(56) References Cited

U.S. PATENT DOCUMENTS

| | | | |
|---|---|---|---|
| 4,450,472 A | 5/1984 | Tuckerman et al. | |
| 4,745,760 A | 5/1988 | Porter | |
| 4,800,422 A | 1/1989 | Sanwo et al. | |
| 4,938,742 A | 7/1990 | Smits | |
| 4,950,181 A | 8/1990 | Porter | |
| 5,001,548 A | 3/1991 | Iversen | |
| 5,016,138 A | 5/1991 | Woodman | |
| 5,179,043 A | 1/1993 | Weichold et al. | |
| 5,218,515 A | 6/1993 | Bernhardt | |
| 5,241,450 A | 8/1993 | Bernhardt et al. | |
| 5,278,103 A | 1/1994 | Mallon et al. | |
| 5,461,003 A | 10/1995 | Havemann et al. | |
| 5,619,177 A | 4/1997 | Johnson et al. | |
| 5,668,398 A | 9/1997 | Havemann et al. | |
| 5,763,951 A * | 6/1998 | Hamilton et al. ........... 257/714 |
| 5,876,187 A | 3/1999 | Forster et al. | |
| 5,901,037 A | 5/1999 | Hamilton et al. | |
| 5,901,556 A * | 5/1999 | Hofler ............................ 62/6 |
| 5,916,247 A * | 6/1999 | Castellanet et al. .......... 62/50.2 |

(Continued)

FOREIGN PATENT DOCUMENTS

WO    WO 98/03996    1/1998

(Continued)

OTHER PUBLICATIONS

IBM Technical Disclosure Bullntin, Electroerosion Micropump, May 1, 1990. Abstract and Figs. 1-3.*

(Continued)

*Primary Examiner*—Chen Wen Jiang
(74) *Attorney, Agent, or Firm*—Knobbe Martens Olson & Bear LLP

(57) ABSTRACT

A cooling mechanism within an integrated circuit includes an internal pump for circulating thermally conductive fluid within closed loop channels. The cooling channels are embedded within an integrated circuit die, such as in inter-level dielectric layers between metal levels. The channels are formed by engineering deposition of a layer to line trenches and form continuous voids along the trenches. Exemplary heat pumps comprise cavities, formed in communication with the channels, covered by piezoelectric actuators. Preferably, the actuators are wired to act in sequence as a peristaltic pump, circulating the fluid within the channels. The channels are positioned to carry heat from active devices within the integrated circuit, and a heat sink carries heat from the die.

8 Claims, 12 Drawing Sheets

U.S. PATENT DOCUMENTS

| | | | |
|---|---|---|---|
| 5,936,295 | A | 8/1999 | Havemann et al. |
| 6,228,744 | B1 | 5/2001 | Levine et al. |
| 6,272,866 | B1 * | 8/2001 | Tsai et al. ............. 62/3.1 |
| 2002/0039280 | A1 | 4/2002 | O'Connor et al. |

FOREIGN PATENT DOCUMENTS

| | | |
|---|---|---|
| WO | WO 98/03997 | 1/1998 |
| WO | WO 98/04109 | 1/1998 |

OTHER PUBLICATIONS

Tay, A., et al., "Analytical Study of A MEMS Micro-Cooling System for Cooling of Flip Chips," Part of the Conference on Design, Characterization, and Packaging for MEMS and Microelectronics, Royal Pines Resort, Queensland, Australia, Oct. 1999, SPIE vol. 3893, pp. 82-93.

"Growth Processes of Silicon Carbide," *The Materials Science SIC Homepage Website*, Dec. 16, 1999, Chapter 4, pp. 1-11.

"MEMS Overview," *Sandia MEMS: Technology Overview*, Sandia National Laboratories: Intelligent Micromachine Initiative Website, Sep. 29, 1999, pp. 1-9.

Arkilic et al., "Gaseous Flow in Micron Sized Channels," *Massachusetts Institute of Technology Website*, 1994, p. 1.

Bindra, Ashok, "KryoTech takes NCR cooling scheme to market," *Electroni Engineering Times*, No. 902, 1996, p. 76.

Di Carlo, Lisa, "Alpha Chills to 767 MHz; Digital increases chip speed with KryoTech cooling system," *PC Week*, vol. 15, No. 15, Apr. 13, 1998, p. 28.

Digital Equipment Corporation, Hardware Product Development, "Digital shows chilled 767-MHz Alpha," *Microprocessor Report*, vol. 10, No. 16, Dec. 9, 1996, p. 5.

Gerlach, T., "Pumping Gases by a Silicon Micro Pump with Dynamic Passive Valves," *Transducers '97, 1997 International Conference on Solid-State Sensors and Actuators*, Chicago, Jun. 16-19, 1997, pp. 357-360.

Gianchandani et al., "Impact of High-Thermal Budget Anneals on Polysilicon as a Micromachined Material," *Journal of Microelectromechanical Systems*, vol. 7, No. 1, Mar. 1998, pp. 102-105.

Hachman, Mark, "Heat Wave!—Today's dense PC chips require lots of cool," *Electronic Buyers News*, No. 1122, 1998, p. 35.

Johnson et al., "Recent progress in thin film shape memory microactuators," *IEEE Micro Electro Mechanical Systems 1995*, 1995, p. 216-220.

Koch et al., "A novel micromachined pump based on thick-film piezoelectric actuation," *Sensors and Actuators*, A 70, 1998, pp. 98-103.

Koch et al., "A Novel Micromachined Pump Based On Thick-Film Piezoelectric Actuation," *Transducers '97, 1997 International Conference on Solid-State Sensors and Actuators*, Chicago, Jun. 16-19, 1997, pp. 353-356.

Krygowski et al., "Infrastructure, Technology and Application Of Micro-Electro-Mechanical Systems (MEMS)," p. 1, presented at Sensors Expo 1999, Cleveland, Ohio, Sep. 14, 1999.

Liu et al., "Sealing of Micromachined Cavities Using Chemical Vapor Deposition Methods: Characterization and Optimization," *IEEE Journal of Microelectomechanical Systems*, vol. 8, No. 2, Jun. 1999, pp. 135-145.

Markus, K., "Developing Infrastructure to Mass-Produce MEMS," *IEEE Computational Science & Engineering*, vol. 4, No. 1, Jan.-Mar. 1997, p. 1.

McWhorter, P., "Vision for MEMS," *Sandia National Laboratories: Intelligent Micromachined Initiative*, Sep. 29, 1999, pp. 1-2.

Mehra et al., "Microfabrication of High Temperature Silicon Devices Using Wafer Bonding and Deep Reactive Ion Etching," *IEEE Journal of Microelectromechanical Systems*, vol. 8, No. 2, Jun. 1999, pp. 152-160.

Saif et al., "Analytical Modeling of Electrostatic Membrane Actuator for Micron Pumps," *IEEE Journal of Microelectromechanical Systems*, vol. 8, No. 3, Sep. 1999, pp. 335-345.

Silcott et al., "SOCs Drive New Product Development," *Computer*, vol. 32, No. 6, Jun. 1999, pp. 61-66.

Smith et al., "Material and processing issues for the monolithic integration of microelectronics with surface-micromachined polysilicon sensors and actuators," *Micromachining and Microfabrication '95*, SPIE, vol. 2639, Oct. 1995, pp. 64-73.

Tay et al., "Review Of The Technology Of Micropumps," *Journal of The Institution of Engineers*, Singapore, vol. 37, No. 4, 1997, pp. 68-72.

Temmel et al., "A Micro Mechanical System For Liquid Dosage And Nebulization," *ACTUATOR 96, 5th International Conference on New Actuators*, Jun. 26-28, 1996, Bremen, Germany, pp. 57-60.

Van De Pol et al., "A Thermopneumatic Micropump Based on Micro-engineering Techniques," *Sensors and Actuators*, A21-A23, 1990, pp. 198-202.

Van Lintel et al., "A Piezoelectric Micropump Based On Micromachining Of Silicon," *Sensors and Actuators*, vol. 15, 1988, pp. 153-167.

Zaghloul et al., "The Teaching of Microelectromechanical Syystems (MEMS)," 1998, p. 1.

Zengerle et al., "A Bidirectional Silicon Micropump," *IEEE Micro Electo Mechanical Systems*, 1995, pp. 19-24.

Office Action dated May 16, 2005 from U.S. Appl. No. 10/639,816, filed Aug. 12, 2003.

* cited by examiner

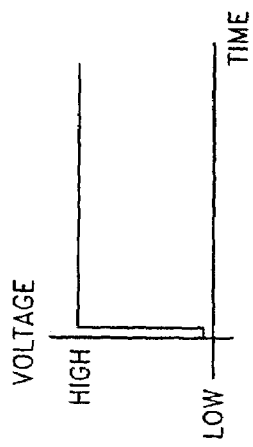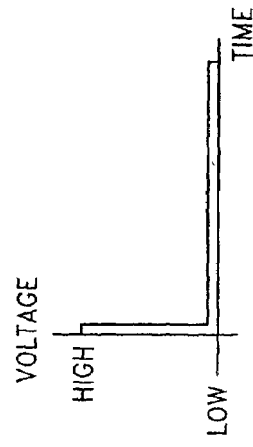
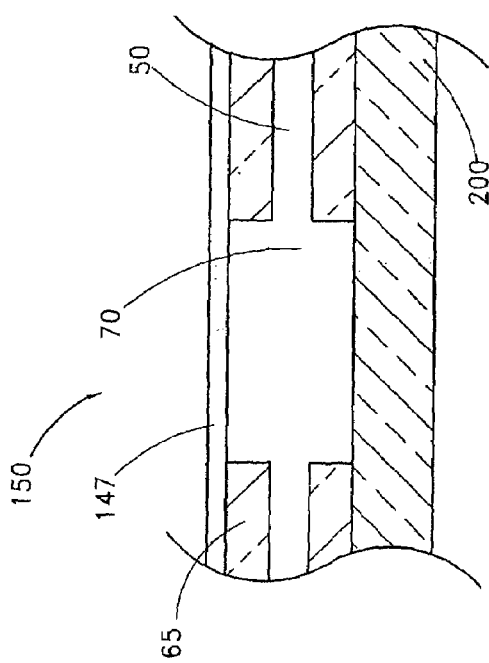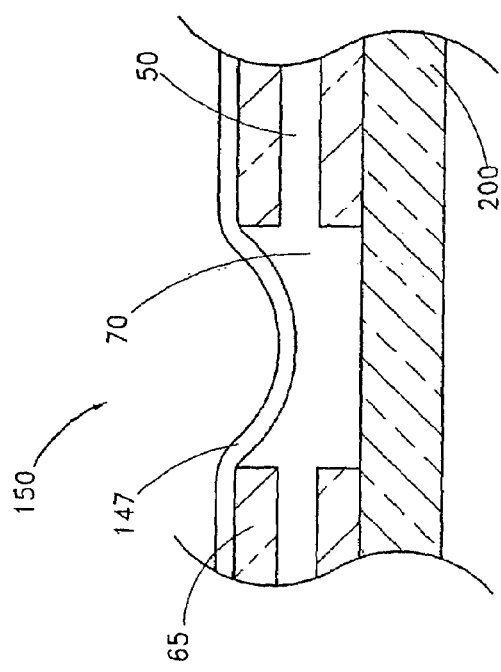
FIG. 8A
FIG. 8B

MEMS HEAT PUMPS FOR INTEGRATED CIRCUIT HEAT DISSIPATION

REFERENCE TO RELATED APPLICATIONS

This application claims the priority benefit under 35 U.S.C. §121 to U.S. application Ser. No. 09/912,631, filed Jul. 23, 2001, now U.S. Pat. No. 6,629,425, issued Oct. 7, 2003, which claims the priority benefit under 35 U.S.C. §119 to Singapore patent application no. 200004125-1, filed Jul. 24, 2000. This application is related to U.S. application Ser. No. 10/639,816, filed Aug. 12, 2003.

FIELD OF THE INVENTION

The present invention relates generally to the cooling of integrated circuits, and more particularly to a MEMS heat pump and cooling channels for cooling integrated circuits.

BACKGROUND OF THE INVENTION

Today's personal computers (PCs) and workstations are experiencing a rapid growth of accelerated clocking and computational speeds. PC clock speeds have progressed from the Intel Corporation 486™ microprocessor speeds of 60 and 90 MHz, to the present Pentium III™ clock speeds in excess of 600 MHz. Moore's Law generally predicts a doubling of computing power and circuit complexity every year and a half or so.

The downside corollary to Moore's Law, however, is that with doubling the number of devices in an integrated circuit (IC) consequently raises the amount of heat generated requiring dissipation. As an integrated circuit drives current between transistors it consumes power, producing waste heat that eventually transfers outward through the chip from the surface of the die. Generally, a PC chip designed for commercial use can withstand up to 150° C. Exceeding that limit, however, will cause the chip to make errors in its calculations, or perhaps fail completely.

Current solutions in heat dissipation for chips include heat spreaders, heat sinks and fans. Heat spreaders, which generally are made of a tungsten-copper alloy and are placed directly over a chip, have the effect of increasing the chip's surface area, allowing more heat to be vented upward. Similarly, heat sinks spread the heat upward through fins or folds, which are vertical ridges or columns that allow heat to be conducted in three dimensions—length, width, and height, as opposed to the two-dimensional length and width of heat spreaders.

Fans within a computer housing can further aid heat dissipation from the chip or heat sink surface by convection. The amount of heat a fan dissipates away from a chip depends on the volume of air the fan moves, the ambient temperature, and the difference between the chip temperature and the ambient temperature.

The miniaturizing of integrated circuits have generally allowed for a reduction of operating voltages, resulting in lower heat production. However, chip shrinkage also means that heat-generating devices are packed closer together. Thus, the "power density" or the amount of heat concentrated at particular spots across the chip may begin to climb. As a consequence, heat is generated faster than it can be dissipated as higher clock speeds are demanded.

For example, PCs with a 486™ microprocessor drew generally 12 to 15 watts, primarily concentrated in the processor. A power supply with an embedded fan was typically sufficient to circulate air and cool the inside of the PC chassis, while a passive heat sink could cool the processor. On the other hand, Pentium™ processors from Intel Corporation consumed about 25 watts, thus requiring more cooling means than the passive heat sink for the processor alone. Similarly, the Pentium II™ processor consumes about 40 watts, while future processors like the 64-bit Merced™ may consume up to 65 watts. Other transistor-laden components must also contend with increasing heat generation: add-on cards; chipsets; graphics chips; and high-performance dynamic random access memory (DRAM).

There is, consequently, a need for improved heat dissipation from integrated circuits.

SUMMARY OF THE INVENTION

These and other needs are satisfied by several aspects of the present invention.

In accordance with one aspect of the invention a cooling system is provided for an integrated circuit. The system comprises a pump that circulates fluid within the integrated circuit. Desirably, the fluid carries heat from regions of heat generation to regions outside the integrated circuit.

In particular, Miniaturized Electro-Mechanical Structure (MEMS) technology is applied to create a miniature electromechanical pump within the chip. The illustrated pump comprises a piezoelectric actuator formed over a cavity in a structural layer. In other arrangements, a MEMS structure formed externally can be placed within the cavity, wired for operation, and sealed within the cavity. The cavity is in fluid communication with fluid-filled channels embedded within the integrated circuit.

The channels are formed, in the preferred embodiments, by etching trenches in a desired pattern, followed by lining the trenches by deposition. The deposition is engineered to create a continuous air gap along the trenches, and the cavity is opened to communicate with this air gap. Desirably, the air gap forms a closed loop including the cavity. After formation of the pump, these channels are then filled with fluid, such as argon, helium or other thermally conductive fluid, and the channels are sealed, such as by lamination of the piezoelectric actuator over the cavity.

In operation, the pump circulates fluid within the channels and preferably carries heat away from heat generating integrated devices, such as fast switching transistors in a logic circuit of a dynamic random access memory (DRAM) chip. In the illustrated embodiment, the channels communicate the heat outwardly from these buried devices, and a heat sink, such as a conventional copper plate, communicates heat away from the die. Moreover, a series of pumps can be arranged in sequence along the channels, and operated in sequence to serve collectively as a peristaltic pump.

BRIEF DESCRIPTION OF THE DRAWINGS

These and further aspects of the invention will be readily apparent to those skilled in the art from the following description and the attached drawings, which are meant to illustrate and not to limit the invention, and wherein:

FIG. 8A is a schematic cross-section of a partially fabricated integrated circuit, illustrating a pump actuator during an active low input signal.

FIG. 8B is a schematic cross-section of a partially fabricated integrated circuit, illustrating a pump actuator during an active high input signal.

DETAILED DESCRIPTION OF THE PREFERRED EMBODIMENT

As noted in the "Background" section above, the trend in integrated circuit fabrication is to further miniaturize devices, condensing larger numbers of transistors in smaller regions. As devices become smaller and more powerful, heat generated by device switching and current driving of more densely packed transistors continues to rise. Various solutions have been implemented in response to the cooling needs of heat-generating devices.

Solutions such as heat spreaders, heat sinks and fans have all aided in cooling such heat-generating devices. Such solutions were generally effective in cooling earlier generation chips. However, as integrated circuits become more and more dense, present cooling measures by external means will soon be ineffective. Furthermore, existing trends dictate that other transistor-laden devices, aside from microprocessors, will similarly require cooling means. Devices such as chipsets, graphics chips, and high-performance DRAM are similarly generating enough heat to warrant their own cooling means in order to avoid computation errors and other general device failures.

It is an object of the present invention to provide cooling means for heat-generating integrated circuits. In the preferred embodiment, an embedded cooling feature for integrated circuits comprises a Miniaturized Electro-Mechanical Structure (MEMS) heat pump in communication with interconnected cooling channels.

MEMS is a relatively new field which exploits existing microelectronics fabrication technology to create complex machines with micron feature sizes. These machines can have many functions, including sensing, communication and actuation.

The mechanical actuation of a MEMS heat pump of the illustrated embodiment effectively circulates a fluid, preferably a gas, through cooling channels, promoting heat energy transfer by forced convection. The cooling channels function as conduits for the circulating fluid that serves as a heat-transferring medium. Generally, heat is absorbed by the fluid near heat-generating devices, carried along with the fluid in the channels, and released to heat sinks leading out of the chip.

Figures 1A, 1B:
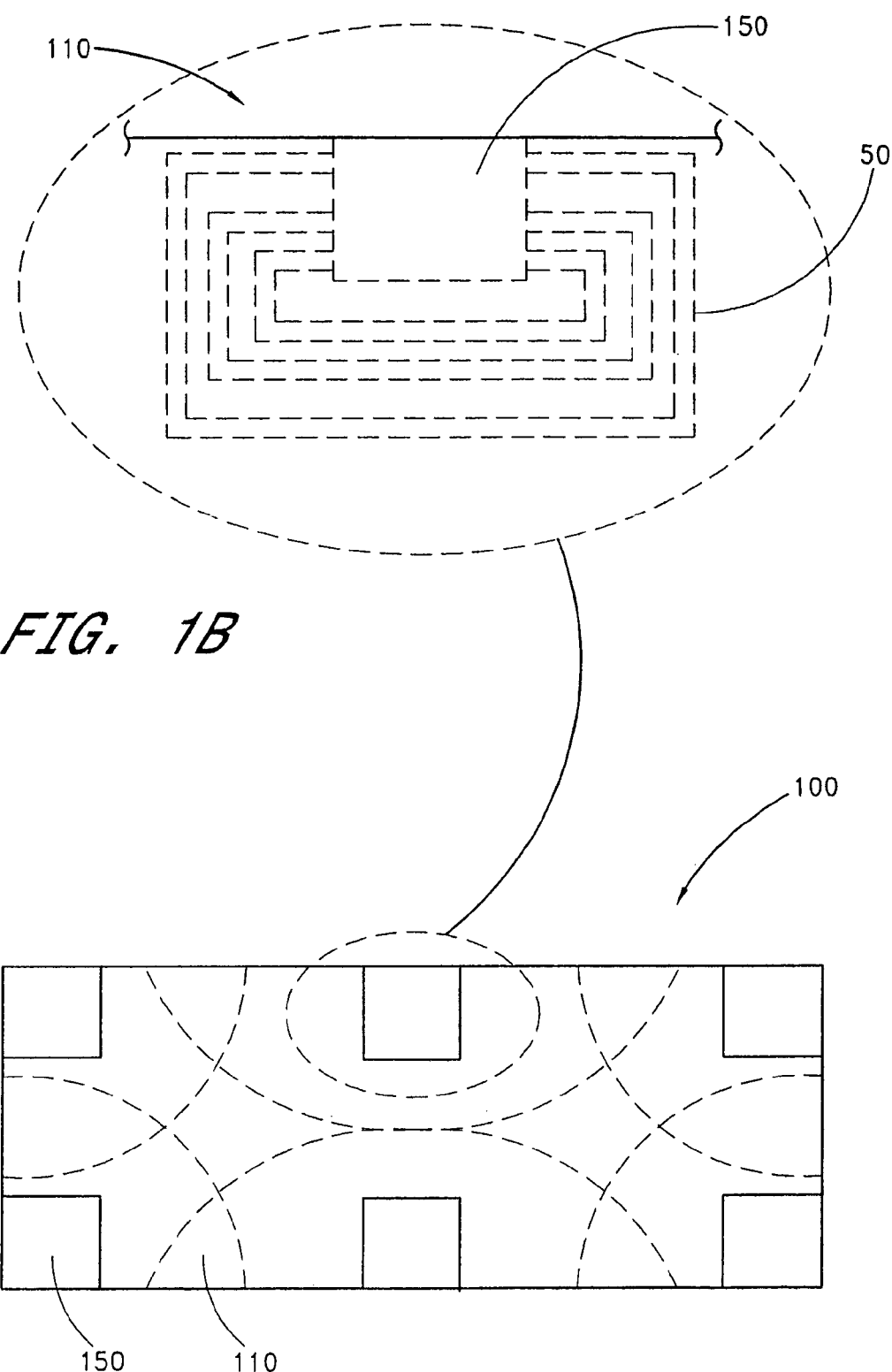
FIG. 1A is a schematic plan view of a partially fabricated integrated circuit, illustrating segmented zones comprising cooling channels and heat pumps.
FIG. 1B is a schematic horizontal cross-section of a segmented zone of FIG. 1A, schematically illustrating the interconnection between cooling channels and a heat pump.

FIG. 1A is a schematic plan view of the preferred embodiment, illustrating an integrated circuit chip or die 100 with segmented zones 110 across the chip. FIG. 1B is an enlarged view of an exemplary zone 110 comprising a MEMS heat pump 150 interconnected with a network of cooling channels 50. The zones 110 can be selected to maximize cooling efficiency, depending on the configuration of the integrated circuit 100. Accordingly, the network of interconnected cooling channels 50 may vary in design layout to best benefit the cooling needs of the particular integrated circuit die 100.

A heat sink is preferably provided to direct the heat energy away from the die 100. In the preferred embodiment, a heat sink or heat conductive plate 130 (see FIG. 12) is bonded to a backside of the die 100. Accordingly, the cooling channels 50 and heat pumps 150 expel thermal energy from within the integrated circuit die 100, while the heat sink 130 carries heat away from the die 100.

It is another object of the present invention to create cooling channels for an integrated circuit by controlling a thin film thickness across a surface topography. The cooling channels preferably contain a fluid that is thermally conductive and has a high specific heat capacity, thus promoting efficient energy transfer to and from the fluid by conduction and transfer along the channels by convection.

The network of cooling channels is by engineering a deposition process to produce continuous voids while lining trenches. Generally, it is desirable for thin films to obtain good step coverage or conformal coverage, wherein equal film thickness exists over all surface topography regardless of its slope (i.e., vertical and horizontal surfaces). However, it is preferable in the illustrated embodiment to engineer a non-conformal thin film. A non-conformal thin film can be realized by physical vapor deposition (PVD) or chemical vapor deposition (CVD), as is well known in the art.

Fabrication of Cooling Channels

FIGS. 2 through 5 illustrate the fabrication of cooling channels 50 in the preferred embodiment.

Figure 2:
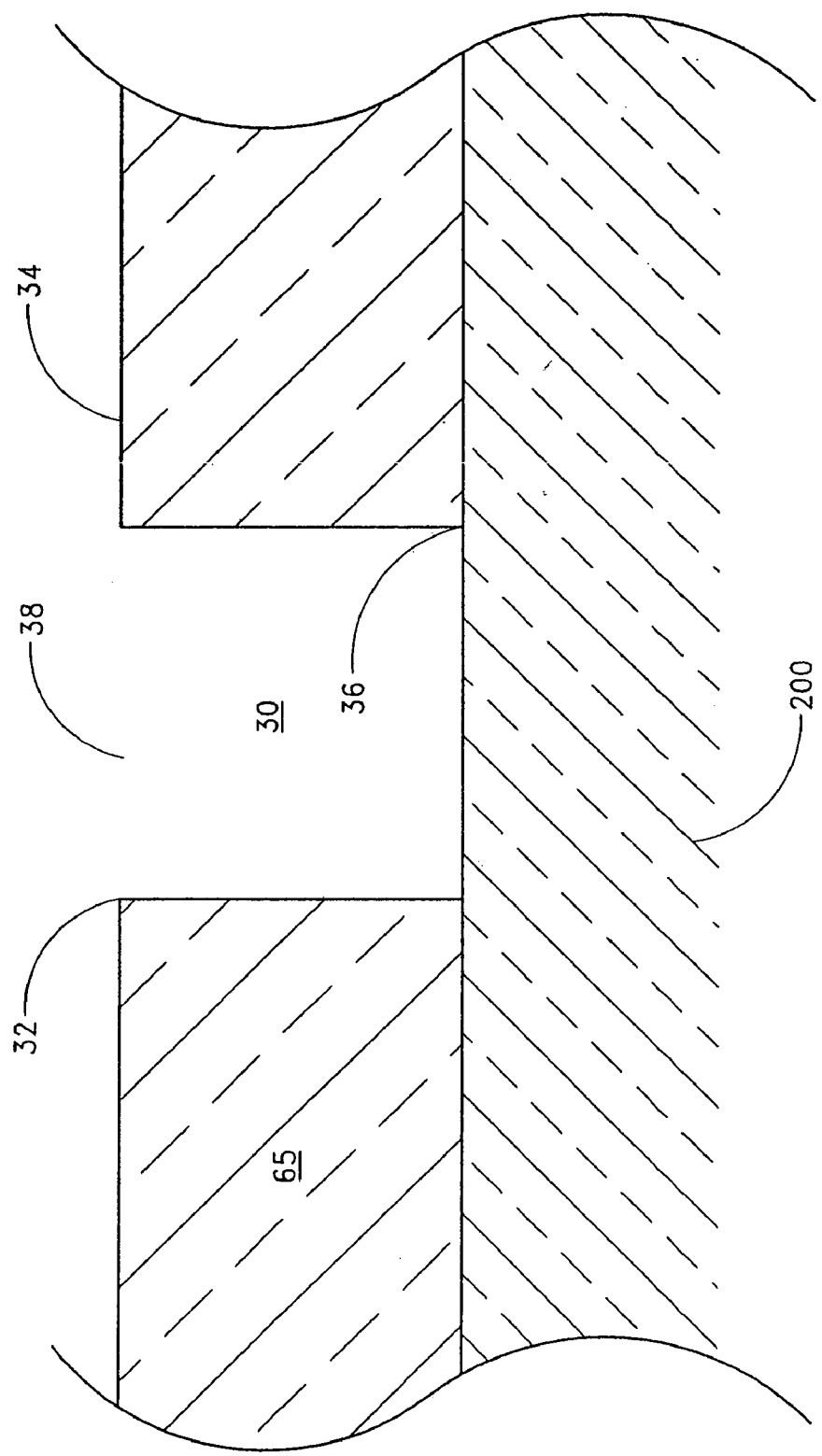
FIG. 2 is a schematic vertical cross-section of a partially fabricated integrated circuit, illustrating a trench overlying a semiconductor substrate.

FIG. 2 is a schematic cross-section, illustrating an opening, preferably an elongated trench 30 within a partially fabricated integrated circuit. The trench 30 is formed within a structural layer 65, such as a typical interlevel dielectric (ILD) material, that is formed over electronic devices such as integrated transistors. The structural layer comprises borophosphosilicate glass (BPSG) in the illustrated embodiment, and overlies a semiconductor substrate 200 in which the electronic devices are (partially) formed. Though not shown, will be understood that there will generally be intervening layers between the structural layer 65 and the substrate. The trench 30 serves as a foundation to form conduits from regions of heat generation throughout the integrated circuit 100 to heat exhaust points. Accordingly, the trench 30 preferably traverses proximate integrated heat-generating electronic devices, such as output driver transistors in logic circuits, particularly in a dynamic random access memory (DRAM) chip.

Within the layer 65, the trench 30 is defined by a top opening 38, bottom corners 36, top corners 32 and a surrounding planar surface 34. The trenches 30 of the preferred embodiment preferably range from about 0.05 µm to 20 µm deep and about 0.1 µm to 10 µm wide, more preferably about 0.2 µm to 5 µm deep and about 0.5 µm to 2 µm wide, and most preferably about 0.5 µm to 2 µm deep and about 0.8 µm to 1.2 µm wide.

At the same time, a larger cavity 70 (FIG. 5) is formed in communication with the trenches 30. Advantageously, the cavity 70 has a significantly smaller aspect ratio.

Figure 3:
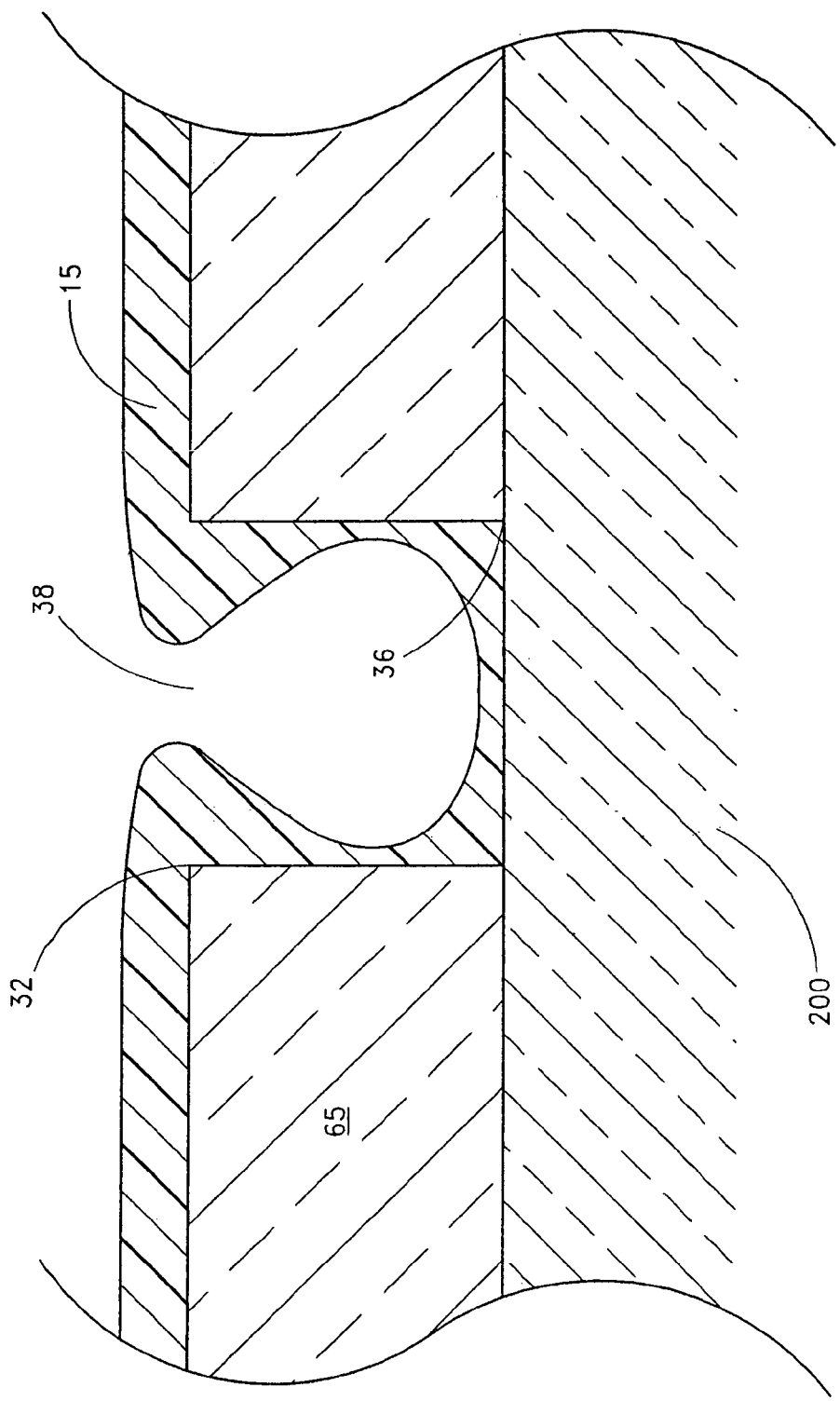
FIG. 3 is a schematic cross-section of the trench of FIG. 2, illustrating a "pinching" effect of a deposited sealant layer.

Referring to FIG. 3, a sealant layer 15 is deposited in the trench 30 by chemical vapor deposition (CVD) to form the cooling channels of the preferred embodiment. For the sealant layer 15, silicon carbide (SiC) is the preferred material for deposition due to its thermal stability, low stress, crack resistance and hermetic characteristics.

The wafer with trenches 30 of the preferred embodiment is introduced into a CVD chamber with a chamber pressure range preferably between about 5 Torr and 10 Torr, more preferably between about 6 Torr and 9 Torr. The temperature range within the process chamber is preferably between about 300° C. and 450° C., more preferably between about 325° C. and 425° C., most preferably between about 350° C. and 400° C.

A silicon source gas such as silane ($SiH_4$) is flowed in the preferred process chamber at a rate of between about 50 sccm and 300, more preferably between about 80 sccm and 200 sccm. Additionally, a carbon precursor, such as methane ($CH_4$), is generally used for the CVD growth of SiC. In the preferred embodiment, $CH_4$ is used as the carbon precursor, and is flowed at a rate of between about 50 sccm and 300, more preferably between about 80 sccm and 200 sccm.

Deposition conditions can be controlled to generally deposit the sealant layer 15 at the top corners 32 at a faster rate than at the bottom corners 36 (see FIG. 3). For the preferred embodiment, the process described above deposits the sealant layer 15 for a duration of 50 seconds, while the pressure is ramped to about 20 Torr. As a result, the sealant layer 15, or silicon carbide (SiC) layer grows more quickly and pinches off at the opening 38 before the trench 30 is completely filled.

Figure 4:
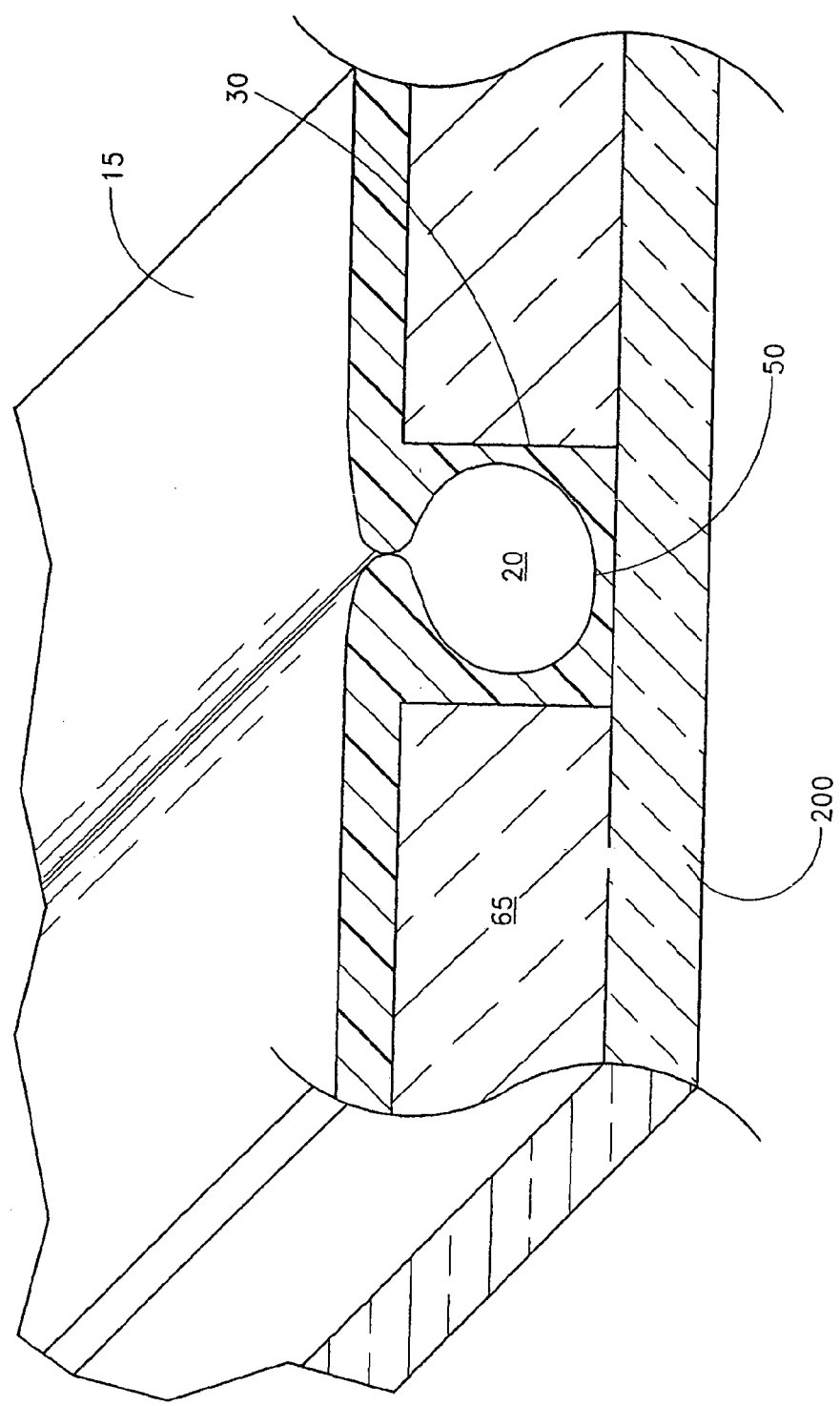
FIG. 4 is an isometric view of a section of a partially fabricated cooling channel.

FIG. 4 is an exemplary view of a cooling channel 50 of the preferred embodiment. The deposited sealant layer 15 seals the opening 38 before trench 30 is filled, consequently forming a sealed air gap 20. The sealed air gap 20 follows the length of the trench 30, forming a tube or channel 50 having a width or diameter on the order of 5,000 Å.

After fabrication of an initial level of cooling channels 50, subsequent layers, such as BPSG, are deposited over the initial layer as the integrated circuit is fabricated, typically in the course of metallization or "back-end" processing. Depending upon the circuit design, the process of etching trenches 30 and depositing sealant layers 15 can be repeated as the layers of the integrated circuit are built up until a desired network of cooling channels is created.

In a typical DRAM fabrication, where a plurality of dies are simultaneously formed on a single large substrate (e.g., 200 mm or 300 mm silicon wafer), at least the steps described up to this point are preferably conducted prior to cutting the substrate into a plurality of dies. Optionally, die cutting can be performed prior to completion of heat pumps, as described below.

Fabrication of MEMS Heat Pumps

It is a further object of the preferred embodiment to provide a circulation means for a fluid that will fill the cooling channels 50. A pump, fan or other circulator is desired to circulate a fluid through the cooling channels 50, enhancing cooling of the integrated circuit.

A heat pump with micron feature sizes is most desirable for it to be effectively incorporated within an integrated circuit. In the preferred embodiment, a MEMS circulator or pump communicates with the network of cooling channels 50. Micro Electro-Mechanical Structures (MEMS) are built by a relatively new technology that exploits an existing microelectronics infrastructure to create mechanical structures on such a micro-scale.

Figure 5:
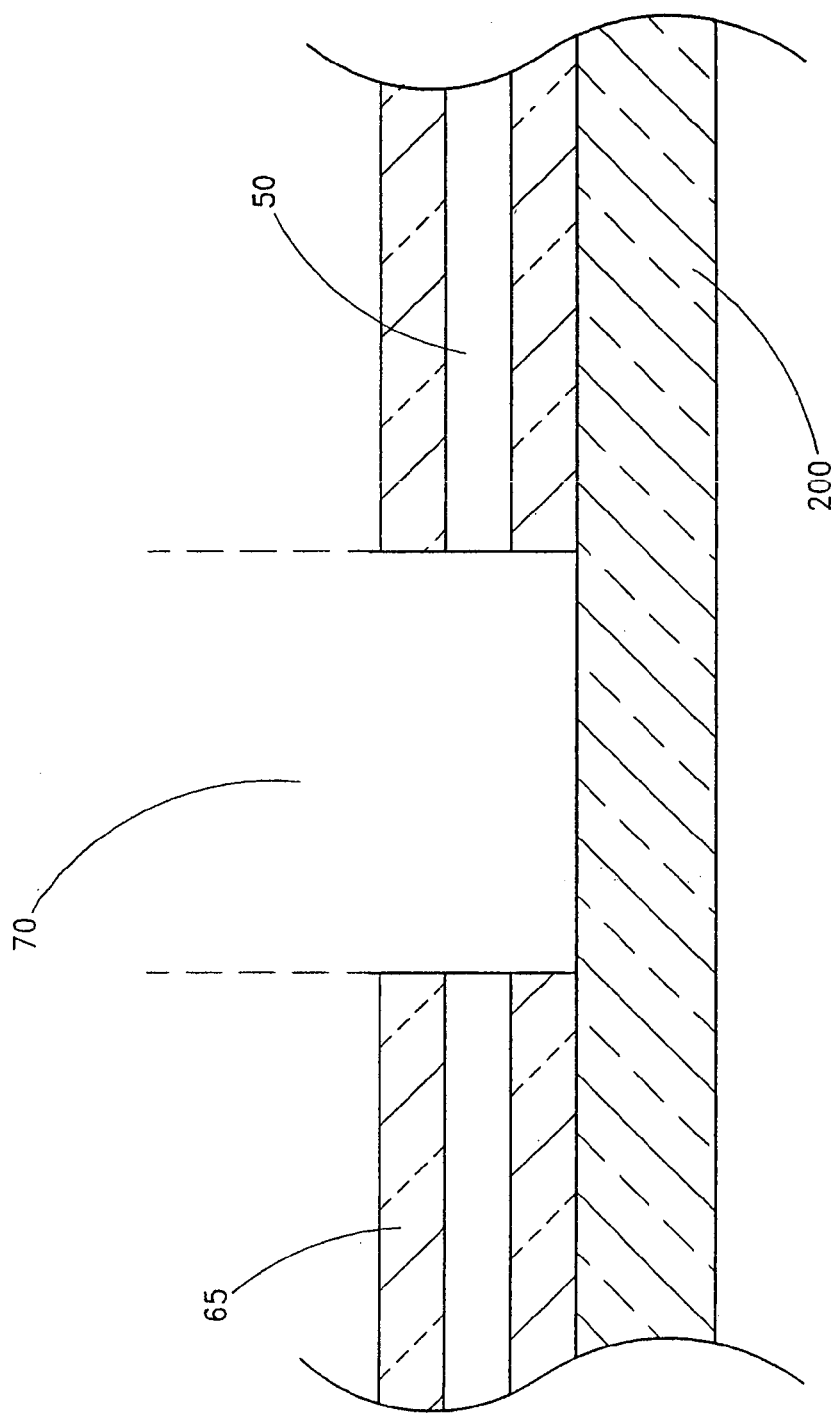
FIG. 5 is a schematic cross-section of a partially fabricated integrated circuit, illustrating the formation of a cavity opening within an insulating layer in communication with cooling channels.

With reference to FIG. 5, an opening or cavity 70 is formed in communication with the cooling channels 50. While shown in communication with only one level of channels, it will be understood that the cavity can extend vertically through multiple levels of the cooling channel network. The cavity 70 is preferably formed within the chip's exclusion zones by conventional photolithography and dry etch processes. Preferably, the cavity 70 has a depth between about 0.05 µm and 20 µm, more preferably between about 0.2 µm and 5 µm, and most preferably between about 0.5 µm and 2 µm. The cavity 70 has a bottom area ranging between about 100 µm$^2$ and 10,000 µm$^2$, more preferably between about 500 µm$^2$ and 5,000 µm$^2$, and most preferably between about 1,000 µm$^2$ and 3,000 µm$^2$.

As noted above, the cavity 70 is preferably formed simultaneously with the trenches 30. Accordingly, the sealant layer 15 coats the cavity 70 walls. However, the much wider cavity 70 has a low aspect ratio. Accordingly, the cavity 70 remains open while the sealant 15 pinches off and encloses the channels 50.

The circulator or MEMS heat pump of the preferred embodiment is formed at the cavity 70 described above. The MEMS heat pump comprises a flexible membrane, preferably a piezoelectric membrane that, when actuated, effectively pumps a fluid through the cavities 70 and interconnected cooling channels 50. In other arrangements, the heat pump can resemble a fan, vibrator or other agitator that is externally micromachined and placed within the cavity to cause circulation of fluid during operation.

Methods for the formation of flexible membranes for pump actuation are known by those skilled in the micromachining art. For example, a method for the formation of a silicon-based micropump is described in the paper, "A Novel Micromachined Pump Based On Thick-Film Piezoelectric Actuation," by Michael Koch et al., *Sensors and Actuators* A70 (1998), pp. 98–103, (hereinafter "Koch et al."), the disclosure of which is incorporated herein by reference. The actuation principle of the exemplary pump relies on the flexure of a screen-printed piezoelectric lead zirconium titanate (PZT) layer on a large-scale silicon membrane.

Figure 6:
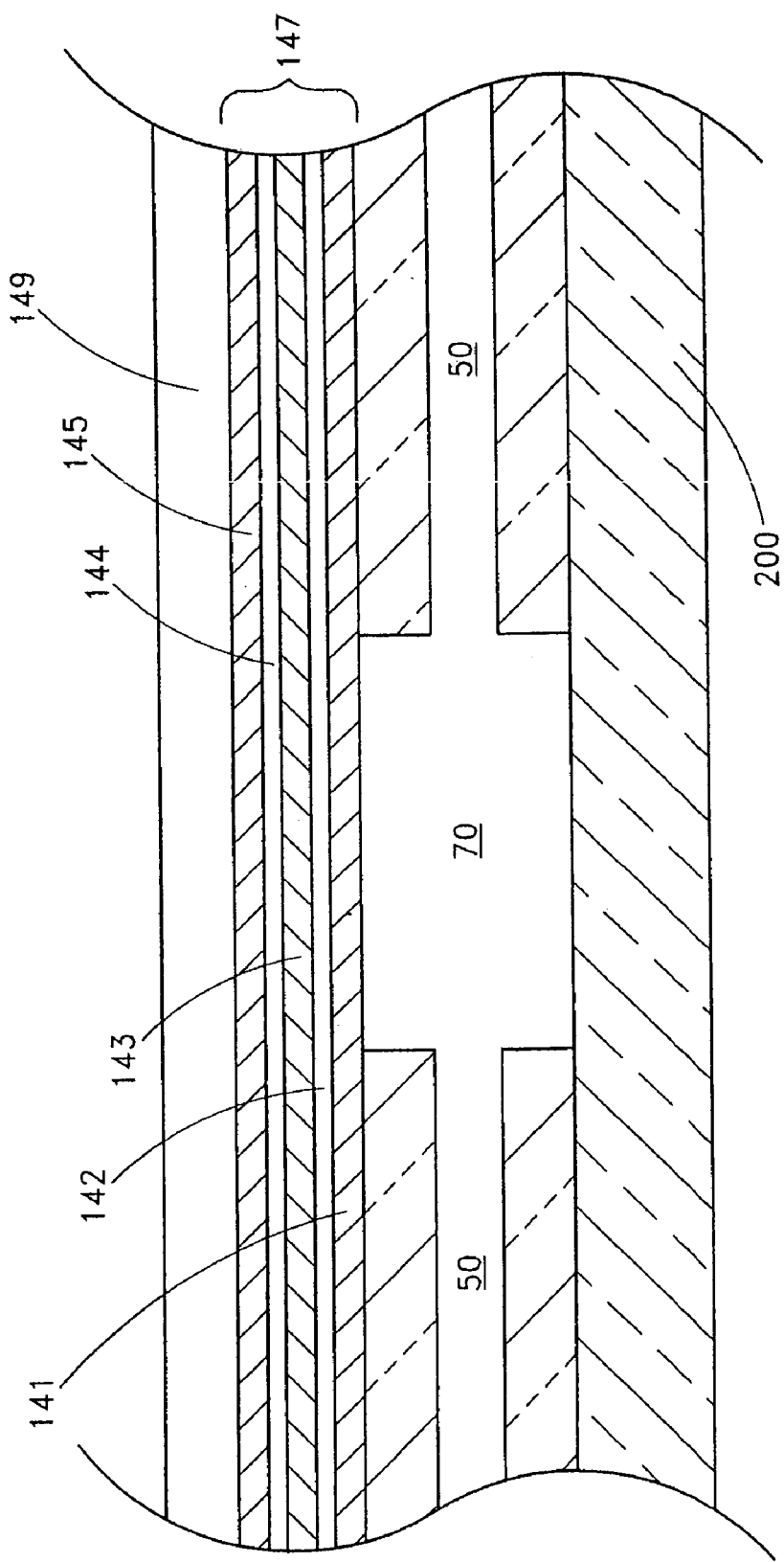
FIG. 6 is a schematic cross-section of a partially fabricated integrated circuit, illustrating a piezoelectric pump actuator laminated over the cavity of FIG. 5.

FIG. 6 illustrates such a flexible membrane or piezoelectric actuator 147 for a MEMS heat pump within an integrated circuit in accordance with the preferred embodiment. Preferably, the piezoelectric actuator 147 is first formed independently and then laminated over the structure of FIG. 5.

Referring to FIG. 6, the actuator 140 comprises a first layer 141 that is flexible enough to bend within the cavity 70.

The first layer 141 preferably comprises a silicon membrane, as described in Koch et al., incorporated by reference above. A thin insulating layer 142, preferably comprising a form of silicon oxide, is optionally formed above the first layer 141. The oxide layer 142 isolates the first layer 141 from the next conductive layer that will comprise the bottom electrode of the pump actuator.

A first conductive layer 143, is deposited above the oxide layer 142. The first conductive layer or bottom electrode 143 comprises any suitable conductive material that can serve as a piezoelectric actuator's electrode in a thickness that remains flexible. Typical electrode metals include aluminum and copper. A piezoelectric layer 144, is formed over the first conductive layer 143. The piezoelectric layer 144 of the illustrated embodiment comprises lead zirconium titanate (PZT). A second conductive layer 145 is formed over the piezoelectric layer 144. The second conductive layer 145 can be any suitable conductor, typically metal, as discussed above with respect to the first conductive layer 143. An exemplary top electrode 145 comprises a 0.5 milli-inch to 5 milli-inch copper foil laminated or epoxied over the PZT 144.

This stack of layers (141, 142, 143, 144 and 145) is patterned (e.g., by photolithography) and etched to isolate a plurality of piezoelectric actuators 147. The individual actuators 147 are made slightly larger than the cavity 70 to allow for placement, such as by pick and place machines, and sealing over the cavity 70. Such lamination can be conducted prior to or after cutting the substrate (e.g., silicon wafer) into a plurality of dies. Together with the cavities 70, the actuators 147 define a plurality of heat pumps 150.

In the course of assembly and sealing of the channels 50, a heat transfer medium, preferably comprising a thermally conductive fluid having a high specific heat capacity, is introduced into the cooling channels 50. Openings to the cooling channels are formed and the workpiece on which the integrated circuit is formed is subjected to the fluid (preferably a gas) while the openings are sealed. Preferably, an inert fluid 25, more preferably a thermally conductive noble gas (e.g., Ar, He, Kr, or Xe) is utilized to fill the cooling channels 50, avoiding unwanted reactions with the process environment and semiconductor layers. Methods for filling cavities or micro-pumps with fluids has been described in "A Piezoelectric Micropump based on Micromachining of Silicon," by H. T. G Van Lintel et al., *Sensors and Actuators*, 15 (1988), pp. 153–167, the disclosure of which is incorporated herein by reference.

Figure 7:
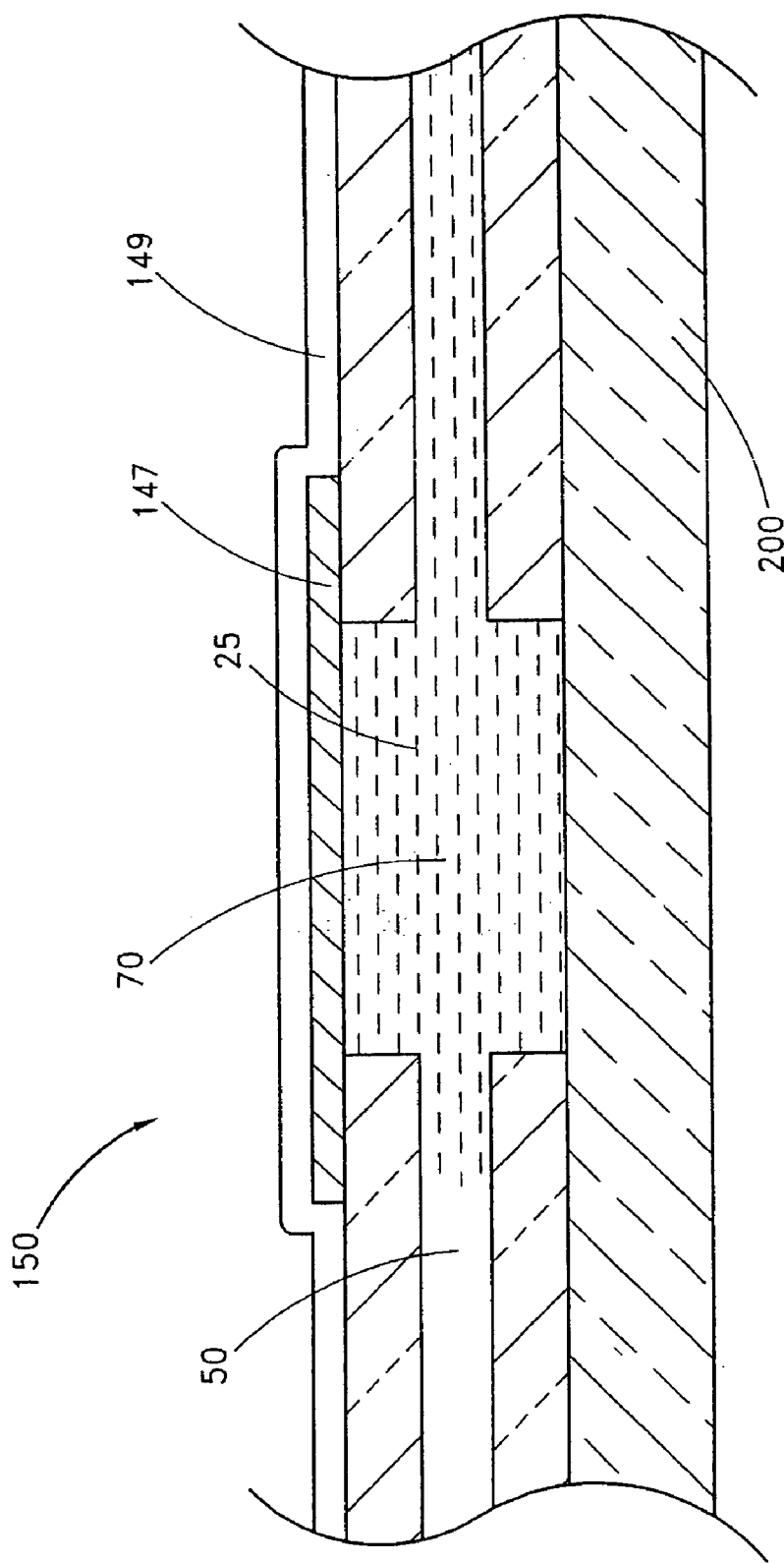
FIG. 7 is a schematic cross-section of a partially fabricated integrated circuit, illustrating a fluid filling the cooling channels and cavity of the structure of FIG. 6.

In the preferred embodiment, the inert fluid 25 is introduced through an opening, preferably through the cavity 70. The MEMS heat pump 150 of FIG. 7 is placed within a process chamber at atmospheric pressure and filled with the desired inert fluid 25. As a result, the cavity 70 and interconnect cooling channels 50 are filled with the desired inert fluid 25. Laminating the actuator 147 over the cavity 70 subsequently seals the cavity 70. The skilled artisan will appreciate A resultant plurality of MEMS heat pumps 150 are preferably arranged and wired in an array to enable pumping the fluid 25 peristaltically (i.e., the fluid 25 is forced onward by the sequential, wavelike contractions of the arrayed heat pumps 150), as will be appreciated from a discussion of the operation, set forth below. The skilled artisan will readily appreciate that each actuator 147 is preferably also wired for operation in the course of lamination. In particular, the electrode layers 143, 145 are preferably electrically connected to a voltage source and to circuitry that times operation of pumps in an array, as described below with respect to FIGS. 9–11.

A passivation layer 149 is desirably deposited over the die 100 after formation of the actuators 147. The passivation layer 149, preferably comprising an insulating barrier such as silicon nitride or silicon oxynitride, is desirably deposited by CVD in a manner that protects the formed piezoelectric actuators 147 from damage. The passivation layer 149 also electrically isolates the piezoelectric actuators 147 from one another and from adjacent electronics. The passivation layer can be formed as part of the laminate, but is more preferably deposited over the entire die after lamination.

Exemplary Operation

FIGS. 8A and 8B illustrate two different positions during pump operation by the application of an input voltage. In the preferred embodiment, the voltage applied to the piezoelectric actuator 147 preferably ranges between about 2 $V_{DC}$ and 24 $V_{DC}$, more preferably between about 5 $V_{DC}$ and 12 $V_{DC}$.

FIG. 8A illustrates the position of an exemplary flexible membrane or piezoelectric actuator 147 during a relaxed (e.g., ~0 $V_{DC}$) or active low state (e.g. $\leq$2 $V_{DC}$), as will be appreciated by the skilled artisan. The piezoelectric actuator 147 can be planar or bends downward as shown, compressing the volume within cavity 70. It should be generally understood that the position of the piezoelectric actuator 147 within the cavity 70 volume is strictly schematic and does not represent an actual compression ratio. Furthermore, the cavity is much larger in the horizontal dimension (as compared to the vertical dimension) than indicated in the figures.

On the other hand, FIG. 8B illustrates the position of the piezoelectric actuator 147 during an active high state (e.g., applied voltage of about ~12 $V_{DC}$). The piezoelectric actuator 147 is electrically forced to actuate and bend in an upward direction. Actuation of the piezoelectric actuator 147, in turn, increases the volume within the cavity 70 creating a low pressure zone that pulls fluid into the cavity 70. When returned to the active low state, the piezoelectric actuator 147 compresses the volume enough to push a fluid out of the cavity 70 and seal the passage of material backward through the system when the next cavity activates (see FIGS. 9A to 11B). The repetitive actuation of the piezoelectric actuator 147 results in the pumping of a fluid through the cavity 70 and interconnected cooling channels 50.

With reference to FIGS. 9A through 11B, an exemplary sequence of pump actuations is illustrated for propelling the fluid 25 onward through sequential cavities 70a, 70b, 70c and interconnected cooling channels 50. The process is illustrated by reference to an arbitrarily defined fluid packet 25a of the continuous fluid filling the interconnected cooling channels 50.

Figure 9A:
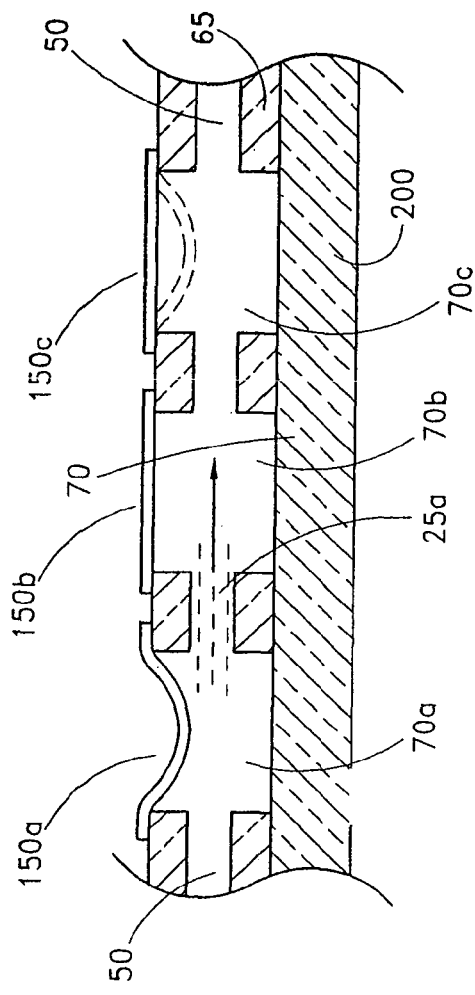
FIG. 9A is a schematic cross-section of a partially fabricated integrated circuit, illustrating the position of a discrete packet of fluid during a first step of operating an exemplary heat pump array.
Figure 9B:
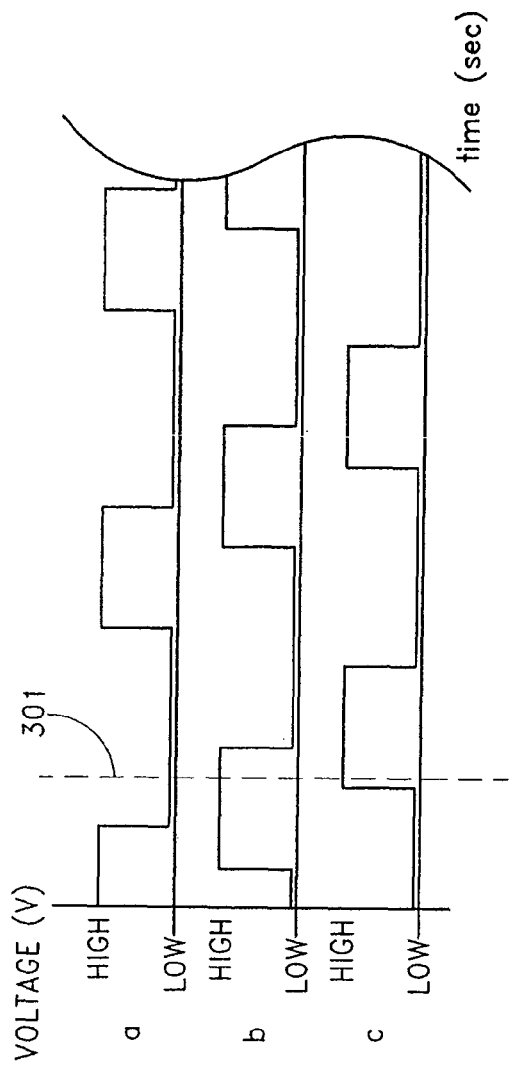
FIG. 9B illustrates a timing diagram corresponding to the first sequential step of FIG. 9A.

In the illustrated embodiment, FIGS. 9A and 9B show an array of MEMS heat pumps 150a, 150b, 150c correspondingly assembled with a sequential array of cavities 70a, 70b, 70c and a preferred timing diagram, respectively. A first moment 301 indicates when the first MEMS heat pump 150a is active low, the second heat pump 150b is active high and the third heat pump 150c is recently transitioned active high. At this first moment 301, the fluid packet 25a is being pulled towards the second cavity 70b shortly after it is compressed out of the first cavity 70a.

Figure 10A:
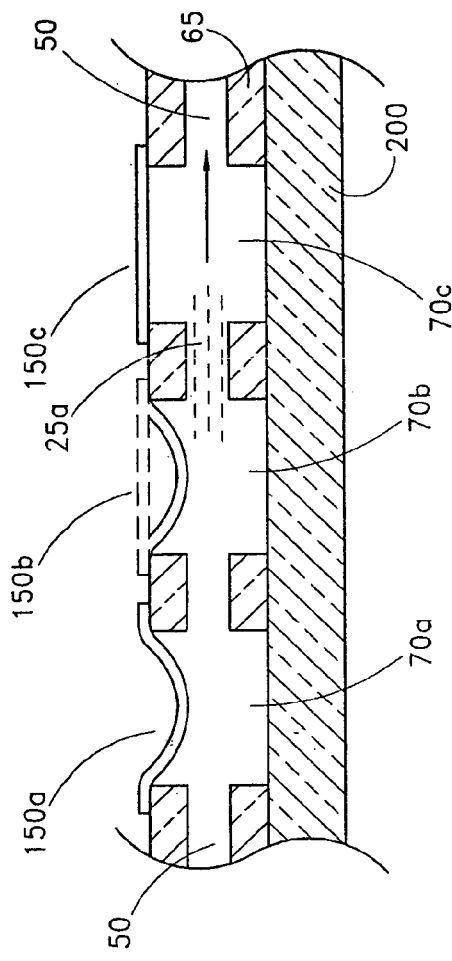
FIG. 10A is a schematic cross-section of a partially fabricated integrated circuit, illustrating the position of the packet of fluid of FIG. 9A during a second step.
Figure 10B:
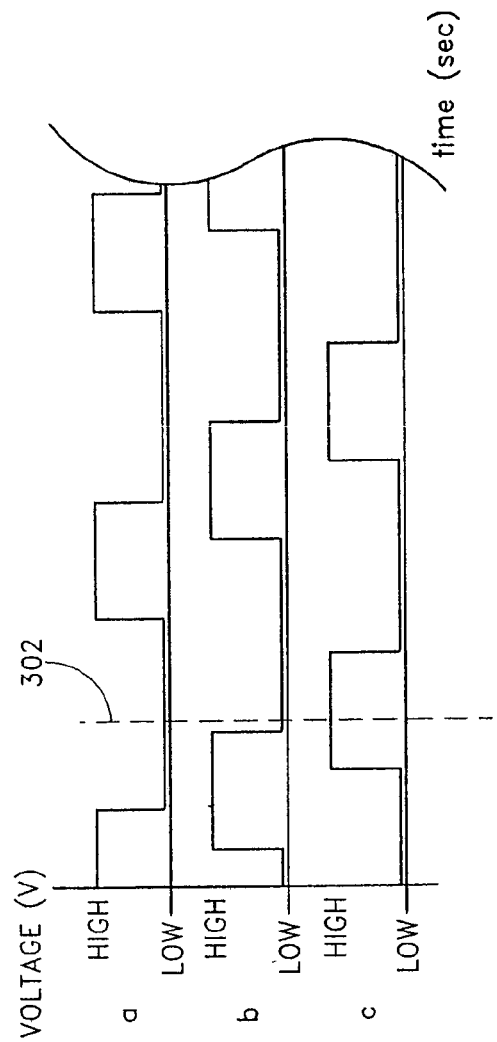
FIG. 10B illustrates a timing diagram corresponding to the second step of FIG. 10A.

Subsequently, FIGS. 10A and 10B illustrate a second moment 302 when the first heat pump 150a is active low, the second heat pump 150b is recently transitioned active low and the third heat pump 150c is active high. During this second moment 302, the fluid packet 25a is compressed out of the second cavity 70b and pulled into the third cavity 70c.

Figure 11A:
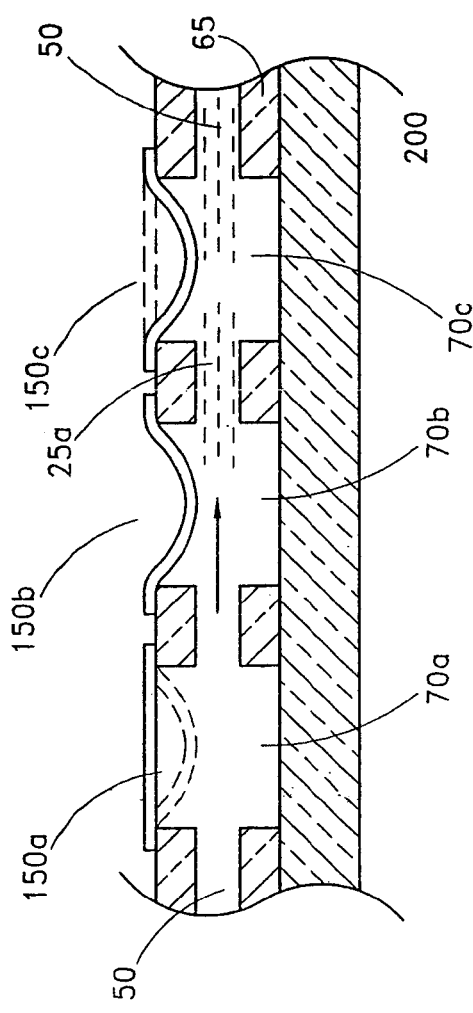
FIG. 11A is a schematic cross-section of a partially fabricated integrated circuit, illustrating the position of the packet of fluid of FIG. 10A during a third step.
Figure 11B:
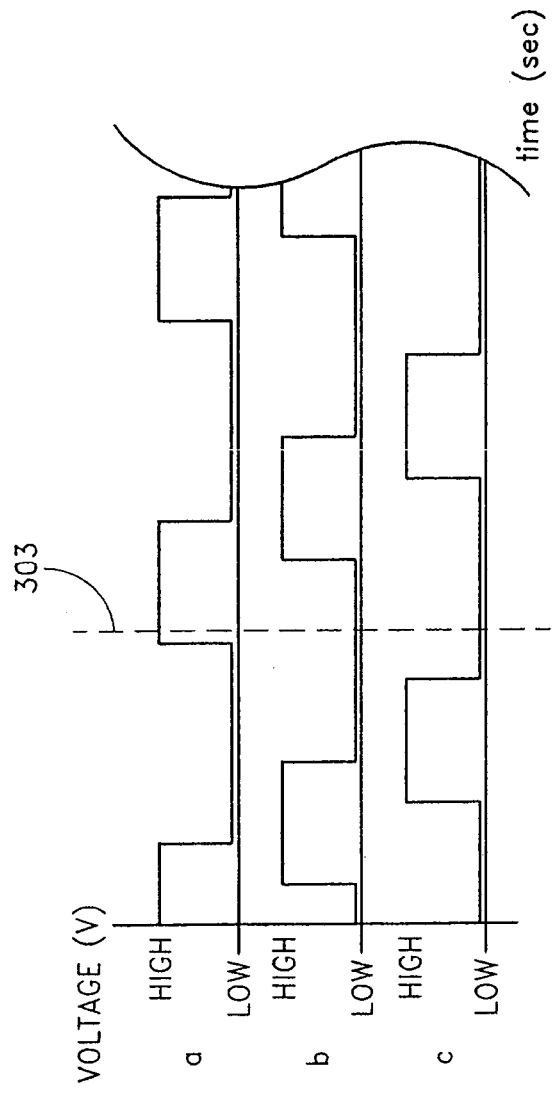
FIG. 11B illustrates a timing diagram corresponding to the third step of FIG. 11A.

FIGS. 11A and 11B illustrate a third moment 303 when the third heat pump 150c is recently transitioned active high, the second heat pump 150b is active low and the third heat pump 150c is also active low. The third moment 303 indicates when the fluid packet 25a is compressed out of the third cavity 70c and into the interconnected cooling channel 50. Also, upstream fluid is subsequently drawn into the first cavity 70a as a result of the upward actuation of the first heat pump 150a to continue the repetitive pumping cycle. With the continuous, sequential actuation of the peristaltic MEMS heat pumps 150, the cooling fluid 25 effectively circulates through the cavities 70 and interconnected cooling channels 50, which, in turn, cools the integrated circuit 100 by forced convection. Most preferably, heat is carried from regions of high heat generation, such as logic circuits of a DRAM chip.

Figure 12:
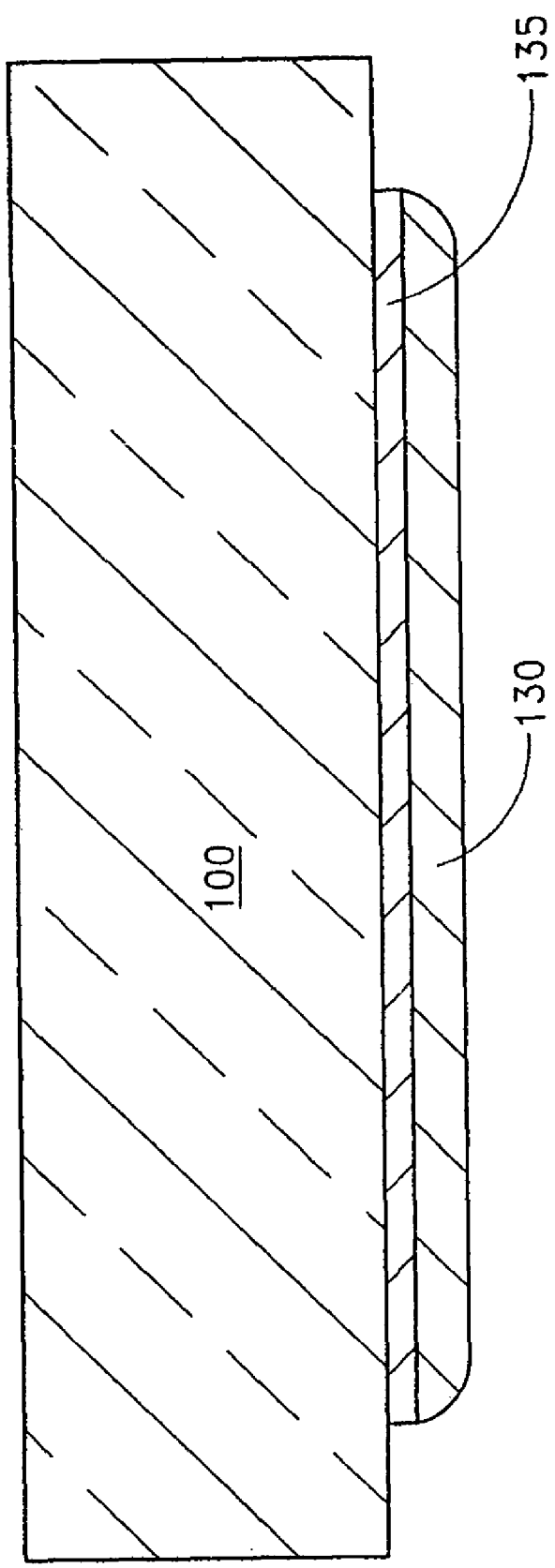
FIG. 12 is a schematic of a partially fabricated integrated circuit, illustrating a thermally conductive plate or heat sink bonded to the die of FIG. 7.

With reference to FIG. 12, another aspect of the present embodiment is to provide a thermally conductive material such that it can conductively carry heat from the cooling fluid within the cooling channels to points outside of the die or chip 100. Generally, a thermally conductive material or a heat sink provides a thermal path, thus directing thermal energy away from its hot region to atmosphere.

The heat sink 130 is preferably made of a high thermal conductivity material, such as copper, and preferably covers a large fraction of the overall integrated circuit 100 area, preferably greater than about 50 percent, more preferably greater than about 80 percent of the overall integrated circuit 100 area. Also, the thickness of the heat sink 130 is preferably between about 1 μm and 20 μm, more preferably between about 5 μm and 10 μm. In the preferred embodiment, the heat sink 130 is aligned with and laminated to a surface of the integrated circuit die 100. The heat sink 130 is bonded to the surface of the die 100 by an epoxy 135, which is also thermally conductive and provides thermal communication between the die 100 and the heat sink 130.

The cooling channels 50 and the MEMS heat pump(s) 150 thus preferably circulate a heat transfer medium, promoting a more efficient cooling of an integrated circuit by forced convection. Advantageously, the preferred embodiment incorporates miniature circulation devices within integrated circuits. The combined effect of a cooling fluid pumping through networked cooling channels within the die 100 and a heat conductive plate that directs heat away from the die 100 effectively cools the integrated circuit die 100 during operation.

Aside from heat pump actuators, other microelectromechanical structure (MEMS) devices can be incorporated to circulate a fluid for cooling of an integrate circuit. A MEMS fan, for example, can similarly force a fluid to flow by the mechanical movement of parts. Other MEMS devices that involve mechanical movement of parts to pump, agitate, otherwise cause a fluid to move or circulate through channels can be employed in the integrated heat pump.

Although the foregoing invention has been described in terms of certain preferred embodiments, other embodiments will become apparent to those of ordinary skill in the art in view of the disclosure herein. Accordingly, the present invention is not intended to be limited by the recitation of preferred embodiments, but is intended to be defined solely by reference to the appended claims.

We claim:

1. A cooling mechanism integrally formed within an integrated circuit comprising a microelectromechanical system (MEMS) heat pump and channels embedded within the integrated circuit; wherein the MEMS heat pump circulates a cooling fluid throughout the channels within the integrated circuit.

2. The cooling mechanism of claim 1, wherein the cooling fluid comprises an inert gas.

3. The cooling mechanism of claim 2, wherein the cooling fluid comprises a thermally conductive noble gas.

4. The cooling mechanism of claim 2, wherein the cooling fluid is selected from the group consisting of argon, helium, krypton and xenon.

5. The cooling mechanism of claim 1, wherein the MEMS heat pump communicates with a network of cooling channels within the integrated circuit.

6. The cooling mechanism of claim 5, wherein the MEMS heat pump comprises a piezoelectric actuator in communication with the cooling channels.

7. The cooling mechanism of claim 6, further comprising a plurality of piezoelectric actuators arrayed along the cooling channels to form a peristaltic pump.

8. The cooling mechanism of claim 1, further comprising a heat sink communicating heat away from the integrated circuit.

* * * * *